(12) United States Patent
Lee et al.

(10) Patent No.: US 7,893,487 B2
(45) Date of Patent: Feb. 22, 2011

(54) RECESSED CHANNEL TRANSISTOR

(75) Inventors: Jin-Woo Lee, Yongin-si (KR);
Tae-Young Chung, Yongin-si (KR);
Joo-Young Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 116 days.

(21) Appl. No.: 12/314,582

(22) Filed: Dec. 12, 2008

(65) Prior Publication Data

US 2009/0152625 A1 Jun. 18, 2009

(30) Foreign Application Priority Data

Dec. 14, 2007 (KR) ................... 10-2007-0131034

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .................. 257/330; 257/328; 257/332; 257/335

(58) Field of Classification Search ............ 257/330, 257/135, 136, 242, 301, 302, 328–329, 335, 257/398, 399, 332, 400
See application file for complete search history.

(56) References Cited

U.S. PATENT DOCUMENTS 7,655,522 B2 * 2/2010 Kim et al. .................. 438/270

FOREIGN PATENT DOCUMENTS

| JP | 2003-179223 A | 6/2003 |
| KR | 10-2005-0045560 A | 5/2005 |
| KR | 10-2007-0002807 A | 1/2007 |

* cited by examiner

*Primary Examiner*—Chuong A. Luu
(74) *Attorney, Agent, or Firm*—Lee & Morse, P.C.

(57) ABSTRACT

A recessed channel transistor includes a single crystalline silicon substrate having a recessed portion, a bottom surface of the recessed portion including an elevated central portion, a channel doping region in the single crystalline silicon substrate, the channel doping region being under the bottom surface of the recessed portion, a gate structure in the recessed portion, and source/drain regions in the single crystalline silicon substrate at both sides of the recessed portion, the source/drain regions being spaced apart from the bottom surface of the recessed portion.

20 Claims, 10 Drawing Sheets

RECESSED CHANNEL TRANSISTOR

BACKGROUND

1. Field

Example embodiments relate to a recessed channel transistor and to a method of manufacturing the same. More particularly, example embodiments relate to a recessed channel transistor used as a switching element of a semiconductor memory device, and to a method of manufacturing the same.

2. Description of the Related Art

As semiconductor devices become highly integrated, width and pitch of patterns in the semiconductor devices may be reduced. For example, a gate width of a transistor, e.g., a recessed channel transistor, in a semiconductor device may be reduced according to a decreased design rule.

A conventional recessed channel transistor may have a recessed channel, so the channel may have a long effective length relative to a short gate width of the transistor. A channel-off leakage current in the recessed channel transistor may be reduced by heavily doping the recessed channel with impurities, while a junction leakage current in the recessed channel transistor may be reduced by minimizing impurities in the recessed channel. Since the channel-off leakage current and the junction leakage current may have a trade-off relation, it may be hard to manufacture a recessed channel transistor having improved electrical characteristics, i.e., reduced leakage of both channel-off current and junction current.

SUMMARY

Example embodiments are therefore directed to a recessed channel transistor and to a method of manufacturing the same, which substantially overcome one or more of the disadvantages of the related art.

It is therefore a feature of an example embodiment to provide a recessed channel transistor with impurities only under a bottom portion of a recessed region thereof to reduce a leakage current.

It is another feature of an example embodiment to provide a method of manufacturing a recessed channel transistor with impurities only under a bottom portion of a recessed region thereof.

It is yet another feature of an example embodiment to provide a semiconductor memory device with a recessed channel transistor having impurities only under a bottom portion of a recessed region thereof.

At least one of the above and other features and advantages of the present invention may be realized by providing a recessed channel transistor, including a single crystalline silicon substrate having a recessed portion, a bottom surface of the recessed portion including an elevated central portion, a channel doping region in the single crystalline silicon substrate, the channel doping region being under the bottom surface of the recessed portion, a gate structure in the recessed portion, and source/drain regions in the single crystalline silicon substrate at both sides of the recessed portion, the source/drain regions being spaced apart from the bottom surface of the recessed portion.

A width of the elevated central portion may substantially equal a distance between the source region and the drain region, the width of the elevated central portion being measured along a direction parallel to a line connecting the source and drain regions. The gate structure may have a non-planar bottom surface, the bottom surface of the gate structure corresponding to a surface profile of the elevated central portion. A portion of the single crystalline silicon substrate may protrude upward along a vertical direction to have a narrow edge and to correspond to the elevated central portion of the bottom surface of the recessed portion, the vertical direction being perpendicular to a plane supporting the single crystalline silicon substrate, and the channel doping region being in the portion of the single crystalline silicon substrate protruding upward. The source/drain regions may be completely spaced apart from the bottom surface of the recessed portion along a vertical direction, the vertical direction being perpendicular to a plane supporting the single crystalline silicon substrate.

The recessed channel transistor may further include an isolation layer pattern in the single crystalline silicon substrate, the isolation layer pattern defining an active region. The recessed portion may be in the active region, and the isolation layer pattern may define a sidewall of the recessed portion. The recessed portion may be in the active region, the recessed portion having a first sidewall, a second sidewall, a third sidewall and a fourth sidewall, the single crystalline silicon substrate being exposed through the first and second sidewalls facing each other, and the isolation layer pattern being exposed through the third and fourth sidewalls facing each other. The channel doping region may be doped with impurities having a conductivity different from a conductivity of impurities in the source/drain regions. The gate structure may protrude from the upper surface of the single crystalline silicon substrate.

At least one of the above and other features and advantages of the present invention may be realized by providing a method of manufacturing a recessed channel transistor, including forming a recessed portion in a single crystalline silicon substrate, forming a channel doping region in the single crystalline silicon substrate, the channel doping region being under a bottom surface of the recessed portion, and the bottom surface of the recessed portion including an elevated central portion, forming a gate structure in the recessed portion, and forming source/drain regions in the single crystalline silicon substrate at both sides of the recessed portion, the source/drain regions being spaced apart from the bottom surface of the recessed portion.

Forming the channel doping region may include doping the single crystalline silicon substrate under the bottom surface and along sidewalls of the recessed portion, and moving silicon atoms from the sidewalls of the recessed portion to the bottom surface of the recessed portion to form the elevated central portion in the bottom surface of the recessed portion, such that impurities in the single crystalline silicon substrate along the sidewalls of the recessed portion are moved with the silicon atoms to be positioned under the bottom surface of the recessed portion. Moving the silicon atoms may be performed by thermally treating the single crystalline silicon substrate under an atmosphere including hydrogen. The thermal treatment may include rapid heating of the single crystalline silicon substrate at a temperature of about 700° C. to about 1,000° C. for about 10 seconds to about 60 seconds. The impurities in the channel doping region may have a conductivity different than a conductivity of impurities in the source/drain regions. The method may further include forming an isolation layer pattern in the single crystalline silicon substrate to define an active region. The recessed portion may be formed in the active region, and the isolation layer pattern may be exposed through a sidewall of the recessed portion. Forming a recessed portion may include forming a mask pattern on the crystalline silicon substrate, the mask pattern selectively exposing a region of the single crystalline silicon substrate where the recessed portion is to be formed, and partially etching the single crystalline silicon substrate using a mask pattern as an etch mask to form the recessed portion.

The recessed portion may have a first sidewall, a second sidewall, a third sidewall and a fourth sidewall, wherein the single crystalline silicon substrate is exposed through the first sidewall and the second sidewall facing each other, and wherein the isolation layer pattern is exposed through the third sidewall and the fourth sidewall facing each other.

At least one of the above and other features and advantages of the present invention may be realized by providing a semiconductor memory device, including a memory cell with at least one recessed channel transistor, the recessed channel transistor having a single crystalline silicon substrate with a recessed portion, a bottom surface of the recessed portion including an elevated central portion, a channel doping region in the single crystalline silicon substrate, the channel doping region being under the bottom surface of the recessed portion, a gate structure in the recessed portion, and source/drain regions in the single crystalline silicon substrate at both sides of the recessed portion, the source/drain regions being spaced apart from the bottom surface of the recessed portion.

BRIEF DESCRIPTION OF THE DRAWINGS

The above and other features and advantages will become more apparent to those of ordinary skill in the art by describing in detail exemplary embodiments with reference to the attached drawings, in which:

FIGS. 4A to 10B illustrate cross-sectional views of stages in a method of manufacturing a recessed channel transistor in accordance with an example embodiment.

DETAILED DESCRIPTION OF THE INVENTION

Korean Patent Application No. 10-2007-0131034, filed on Dec. 14, 2007, in the Korean Intellectual Property Office, and entitled: "Recessed Channel Transistor and Method of Manufacturing the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers, elements, and regions may be exaggerated for clarity of illustration. It will also be understood that when a layer or element is referred to as being "on" another layer, element, or substrate, it can be directly on the other layer, element, or substrate, or intervening layers and/or elements may also be present. Further, it will be understood that when a layer is referred to as being "under" another layer, it can be directly under, and one or more intervening layers may also be present. Also, it will also be understood that when a layer or element is referred to as being "between" two layers or elements, it can be the only layer or element between the two layers or elements, or one or more intervening layers and/or elements may also be present. In addition, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like reference numerals refer to like elements throughout.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an nth member, where n is greater than 3, whereas the expression "at least one selected from the group consisting of A, B, and C" does not.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
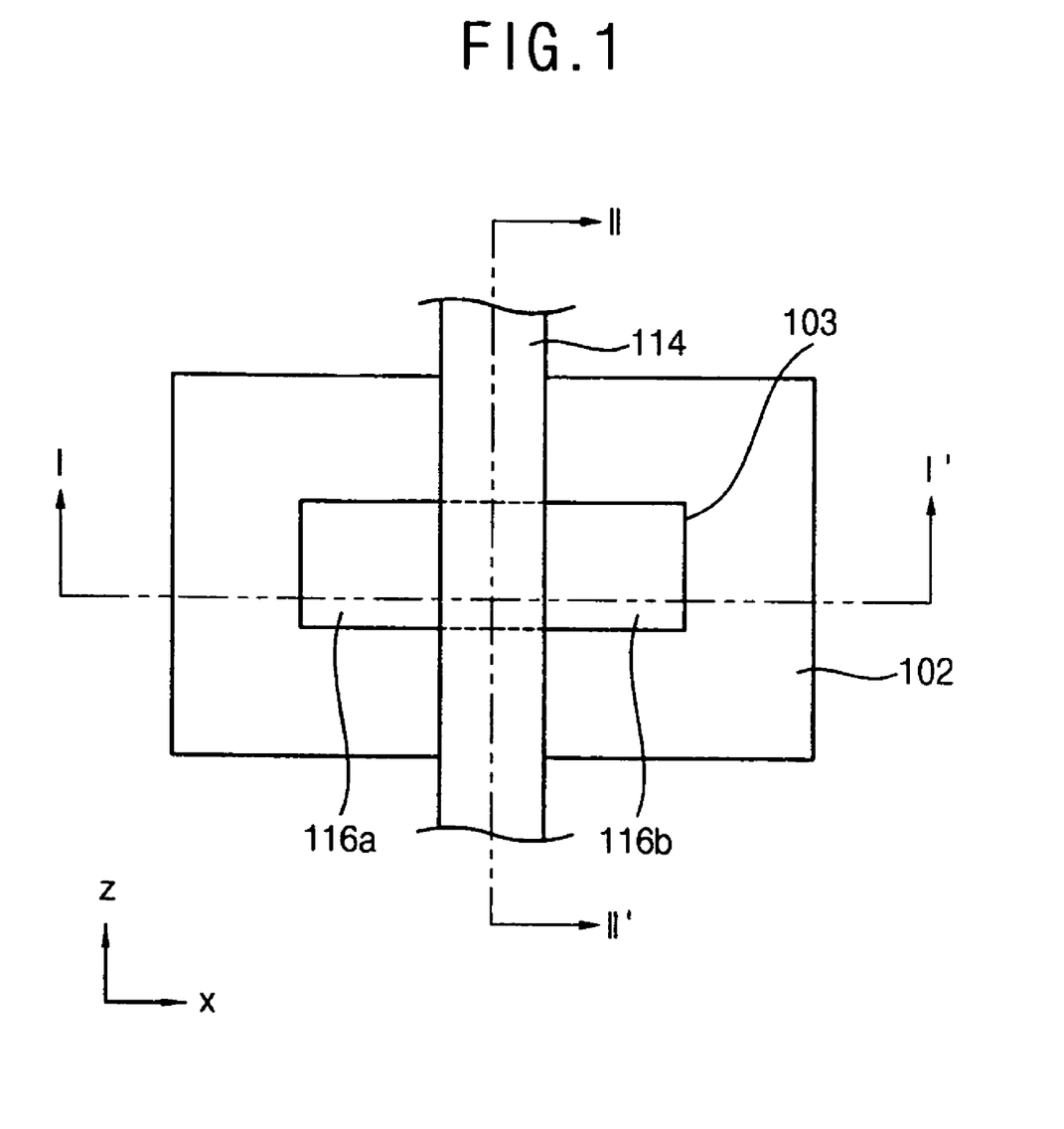
FIG. 1 illustrates a plan view of a recessed channel transistor in accordance with an example embodiment.
Figure 2:
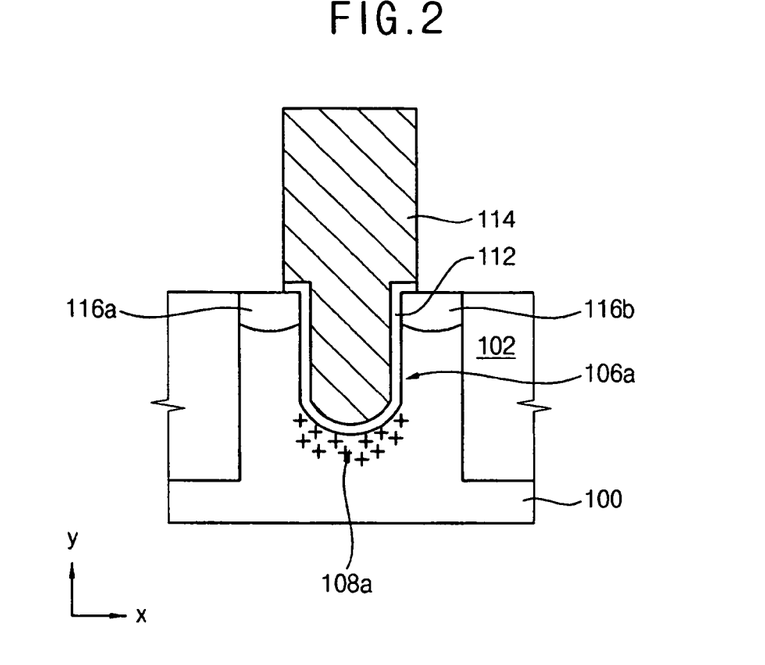
FIG. 2 illustrates a cross-sectional view along line I-I' in FIG. 1.
Figure 3:
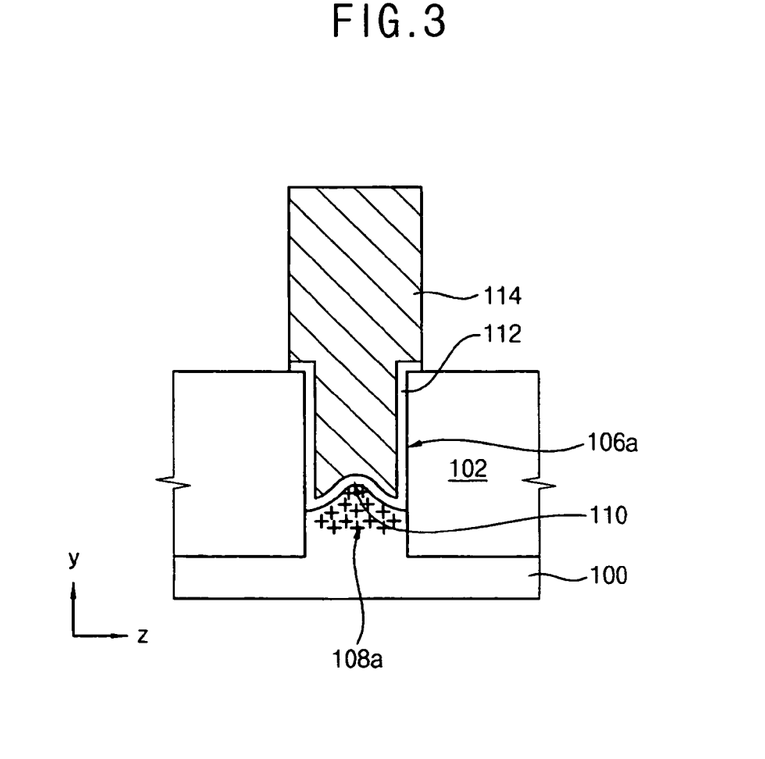
FIG. 3 illustrates a cross-sectional view along line II-II' in FIG. 1.

Hereinafter, an example embodiment will be explained in detail with reference to FIGS. 1-3. FIG. 1 illustrates a plan view of a recessed channel transistor in accordance with some example embodiments, FIG. 2 illustrates a cross-sectional view along line I-I' in FIG. 1, and FIG. 3 illustrates a cross-sectional view along line II-II' in FIG. 1. It is noted that line I-I' in FIG. 1 is along an edge of an active region, while line II-II' in FIG. 1 is along a center of the active region and is perpendicular to line I-I'.

Referring to FIGS. 1 to 3, a recessed channel transistor may include a single crystalline silicon substrate 100, a recessed portion 106a in the crystalline silicon substrate 100, a gate electrode 114 in the recessed portion 106a, and a channel doping region 108a under a bottom of the recessed portion 106a. The recessed portion 106a may further include source and drain regions 116a and 116 on both sides of the recessed portion 106a.

The single crystalline silicon substrate 100 may be any suitable semiconductor substrate, and may include an isolation layer pattern 102 for defining an active region 103. For example, as illustrated in FIG. 1, the active region 103 may have an isolated island shape, so the isolation layer pattern 102 may be configured to surround the isolated active region 103. For example, the isolation layer pattern 102 may be formed by filling a trench in the single crystalline silicon substrate 100 with, e.g., an insulating material.

The recessed portion 106a may be formed in the active region 103 of the single crystalline silicon substrate 100, e.g., the recessed portion 106a may be positioned at a region where a gate may be formed subsequently. The recessed portion 106a may be a volumetric opening extending from an uppermost surface of the single crystalline silicon substrate 100, i.e., from an uppermost surface of the active region 103, in a downward direction toward a lowermost surface of the single crystalline silicon substrate 100. The recessed portion 106a may have first and second sidewalls facing each other, and may have third and fourth sidewalls facing each other. For example, the third sidewall may be between the first and second sidewalls, and the fourth sidewall may be between the first and second sidewalls, so the first through fourth sidewalls may form an opening having, e.g., a prism shape. For example, as illustrated in FIGS. 2-3, the first through fourth sidewalls of the recessed portion 106a may be in a vertical plane, e.g., may be substantially perpendicular to a plane supporting the single crystalline silicon substrate 100.

The first and second sidewalls of the recessed portion 106a may be defined by the isolation layer pattern 102, i.e., the isolation layer pattern 102 may be exposed through the first and second sidewalls of the recessed portion 106a. The third and fourth sidewalls of the recessed portion 106a may be defined by the active region 103 of the single crystalline silicon substrate 100, i.e., the active region 103 may be exposed through the third and fourth sidewalls of the recessed portion 106a. In other words, as illustrated in FIGS. 2-3, sidewalls of the recessed portion 106a may be arranged to be defined by the active region 103 and the isolation layer pattern 102. For example, as illustrated in FIGS. 1 and 3, a width of the recessed portion 106a along the z-axis may sustainably equal a width of the active region 103 in the z-axis.

As further illustrated in FIGS. 2-3, the recessed portion 106a may have a non-planar bottom surface, i.e., a surface in a xz-plane. More specifically, the bottom surface of the recessed portion 106a may be curved in the xy-plane at edges of the active region 103, as illustrated in FIGS. 1-2, and may include an elevated central portion 110 in a center thereof, as illustrated in plane xy of FIG. 3. In other words, a central portion of the bottom surface of the recessed portion 106 may protrude inward toward an interior of the recessed portion 106, e.g., to form a concave surface. As further illustrated in FIG. 3, the elevated central portion 110 of the recessed portion 106a may have a narrow edge, and may extend between the first and second sidewalls of the recessed portion 106a along the z-axis. A width of the elevated central portion 110 may extend along a lengthwise direction of the active region 103, i.e., along the x-axis. The recessed portion 106a may be configured to extend from the source region 116a to the drain region 116b in the active region 103.

The channel doping region 108a may be formed in the single crystalline silicon substrate 100 under the bottom surface of the recessed portion 106a. For example, the channel doping region 108a may be formed only under the bottom surface of the recessed portion 106a, so impurities in the channel doping region 108a may be only under the bottom surface of the recessed portion 106a, e.g., the channel doping region 108a may not overlap any portions of the vertical sidewalls of the recessed portion 106a. The channel doping region 108a may be doped with impurities having a conductive type different from that of impurities in the source/drain regions 116a and 116b. In other words, when the recessed channel transistor includes an N type transistor, the channel doping region 108a may be doped with P type impurities. Similarly, when the recessed channel transistor includes a P type transistor, the channel doping region 108a may be doped with N type impurities. For example, a channel portion adjacent to the channel doping region 108a may be lightly doped with the P type impurities, and the channel doping region 108a may be heavily doped with the P type impurities. A threshold voltage of the recessed channel transistor may be controlled in accordance with a doping concentration of the channel doping region 108a. Further, a turn-off leakage current of the recessed channel transistor may be reduced due to the impurities in the channel doping region 108a.

A gate structure may be formed in the recessed portion 106a. The gate structure may include a gate insulating layer pattern 112 and the gate electrode 114. For example, the gate insulating layer pattern 112 may be formed, e.g., by a thermal oxidation process using silicon oxide, on the sidewalls and the bottom surface of the recessed portion 106a. It is noted that the gate insulating layer pattern 112 may be formed, e.g., conformally, along the elevated surface profile of the bottom surface of the recessed portion 106a.

The gate electrode 114 may be formed on the gate insulating layer pattern 112 to fill, e.g., completely fill, the recessed portion 106a. The gate electrode 114 may protrude above the uppermost surface of the single crystalline silicon substrate 100, e.g., an upper surface of the gate electrode 114 facing away from the single crystalline silicon substrate 100 may be at a higher vertical level along the y-axis relative to the bottom surface of the recessed portion 106a as compared to the uppermost surface of the single crystalline silicon substrate 100. The gate electrode 114 may be configured to surround the elevated central portion 110 of the bottom surface of the recessed portion 106a. For example, as illustrated in FIG. 3, the elevated central portion 110 of the bottom surface of the recessed portion 106a may protrude in an upward direction to extend away from the channel doping region 108a, so portions of the gate electrode 114 may surround the elevated central portion 110, e.g., surround entire protruding portion to completely overlap. In other words, a bottom surface of the gate electrode 114, i.e., a surface opposite the upper surface thereof, may be non planar to correspond to a surface profile of the elevated central portion 110.

Therefore, since the bottom surface of the gate electrode 114 may be curved, i.e., surrounding the elevated central portion 110, as opposed to flat, a width of the bottom surface of the gate electrode 114 along a contour thereof, e.g., along the z-axis may be increased due to the elevated central portion 110 of the recessed portion 106a. Further, since the elevated central portion 110 may have a narrow edge, when the recessed channel transistor is operated, an electric field may be concentrated in the elevated central portion 110 of the bottom surface of the recessed portion 106a, so the recessed channel transistor according to an example embodiment may have operational characteristics substantially similar to those of a fin transistor. As a result, the recessed channel transistor may have improved on/off characteristics and an increased on-current.

The source/drain regions 116a and 116b may be formed in the upper surface of the single crystalline silicon substrate 100 at both sides of the recessed portion 106a. For example, the source/drain regions 116a and 116b may be spaced apart from the bottom surface of the recessed portion 106a along the y-axis. Therefore, the source/drain regions 116a and 116b may not be in contact with the channel doping region 108a. For example, since the channel doping region 108a may be only under the recessed portion 106a, i.e., sidewalls of the recessed portion 106a may not be doped with impurities, portions of the single crystalline silicon substrate 100 may separate the channel doping region 108a from each of the source/drain regions 116a and 116b, e.g., completely separate the channel doping region 108a from the source/drain regions 116a and 116b.

According to an example embodiment, a recessed channel transistor may include a channel doping region locally formed in a substrate only under a recessed portion. Thus, because the channel doping region may not directly make contact with the source/drain regions, a junction leakage current in the source/drain regions, which may be generated at a junction region between the source/drain regions and the channel doping region heavily doped with impurities, may not be generated. Further, a channel-off leakage current in the channel doping region may also be reduced due to control of a doping concentration in the channel doping region. Therefore, a power consumption of a semiconductor device including the recessed channel transistor during a standby time may be reduced due to the low leakage current. As a result, when the recessed channel transistor is used as a cell transistor of a Dynamic Random Access Memory (DRAM) device, a cell of the cell transistor may have improved data retention characteristics.

Another example embodiment will be described hereinafter with reference to FIGS. 4A to 10B illustrating stages in a method of manufacturing a recessed channel transistor. FIGS. 4-10 labeled with "A," i.e., FIGS. 4A-10A, illustrate cross-sectional views corresponding to line I-I' of FIG. 1 representing sequential stages in a method of manufacturing the recessed channel transistor of FIG. 1-3. FIGS. 4-10 labeled with "B," i.e., FIGS. 4B-10B, illustrate cross-sectional views corresponding to line II-II' of FIG. 1 representing sequential stages in a method of manufacturing the recessed channel transistor of FIG. 1-3. Directions of lines I-I' and II-II' are substantially perpendicular to each other.

Figure 4A:
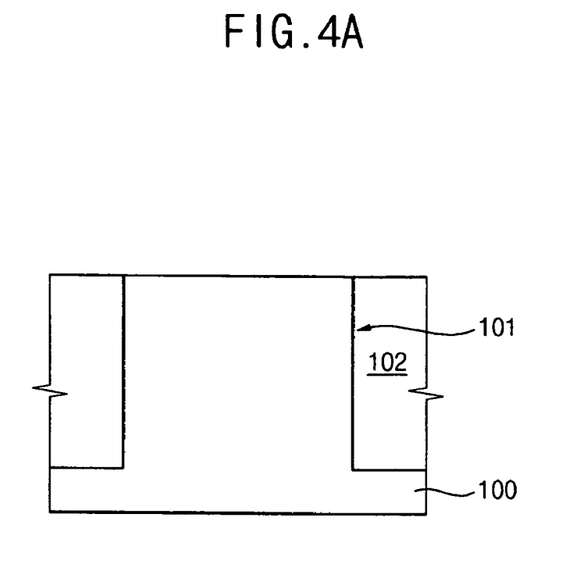
Figure 4B:
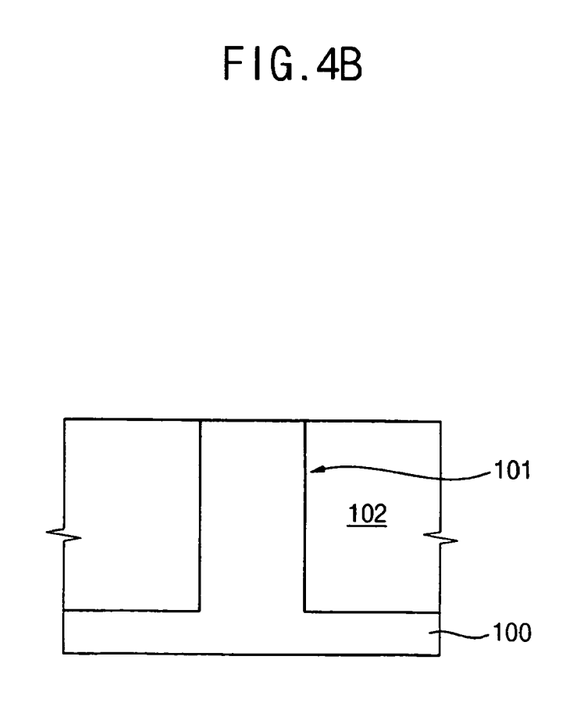

Referring to FIGS. 4A and 4B, the isolation layer patterns 102 may be formed in the single crystalline silicon substrate 100 to define the active region 130. For example, the isolation layer patterns 102 may include oxide, e.g., silicon oxide. The isolation layer patterns 102 may be formed by an isolation process, e.g., a shallow trench isolation (STI) process.

For example, a first mask pattern (not shown) configured to selectively expose regions of the single crystalline silicon substrate 100 where the isolation layer patterns 102 are to be formed may be formed on the single crystalline silicon substrate 100, so portions of the single crystalline silicon substrate 100 corresponding to the active region may be covered by the first mask pattern. The active region may have an island shape, so that the first mask pattern may have an isolated shape. The single crystalline silicon substrate 100 may be etched using the first mask pattern as an etch mask to form isolation trenches 101. The isolation trenches 101 may be filled with an insulating material, e.g., silicon oxide, followed by planarization of the insulating material to form the isolation layer patterns 102. The isolation layer patterns 102 may be configured to surround the active region of the single crystalline silicon substrate 100. After forming the isolation layer patterns 102, the first mask pattern may be removed.

Figure 5A:
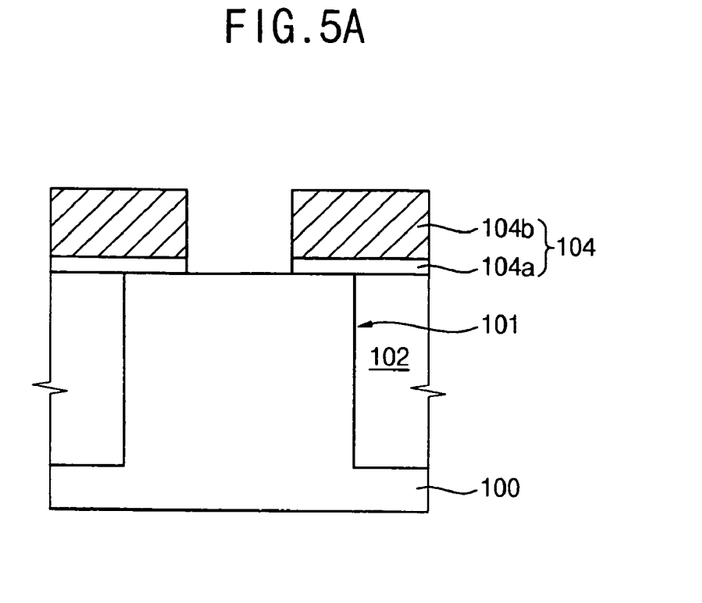
Figure 5B:
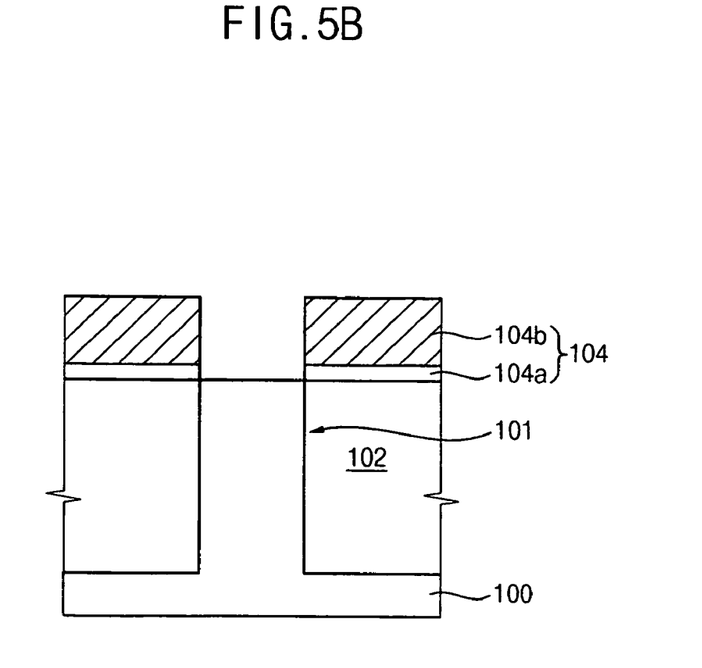

Referring to FIGS. 5A and 5B, a second mask pattern 104 may be formed on the single crystalline silicon substrate 100 and the isolation layer patterns 102, such that a portion of the single crystalline silicon substrate 100 to be removed may be exposed. That is, the second mask pattern 104 may include an opening selectively exposing a portion of the active region of the single crystalline silicon substrate 100 where the recessed portion 106a is to be formed in a subsequent process.

The second mask pattern 104 may have a sequentially stacked structure of a pad oxide layer pattern 104a and a silicon nitride layer pattern 104b. For example, a pad oxide layer (not shown) and a silicon nitride layer (not shown) may be sequentially formed on the single crystalline silicon substrate 100. The pad oxide layer and the silicon nitride layer may be patterned, e.g., by a photolithography process, to form the second mask pattern 104. For example, the pad oxide layer may be formed by depositing a middle temperature oxide via, e.g., a chemical vapor deposition (CVD) process, a plasma-enhanced chemical vapor deposition (PECVD) process, an atomic layer deposition (ALD) process, a low-pressure chemical vapor deposition (LPCVD) process, a high-density plasma chemical vapor deposition (HDP-CVD) process, and so forth. The silicon nitride layer may be formed by, e.g., a CVD process, a PECVD process, an ALD process, an LPCVD process, a sputtering process, and so forth. The silicon nitride layer may have an etching selectivity with respect to the single crystalline silicon substrate 100 and the pad oxide layer.

Figure 6A:
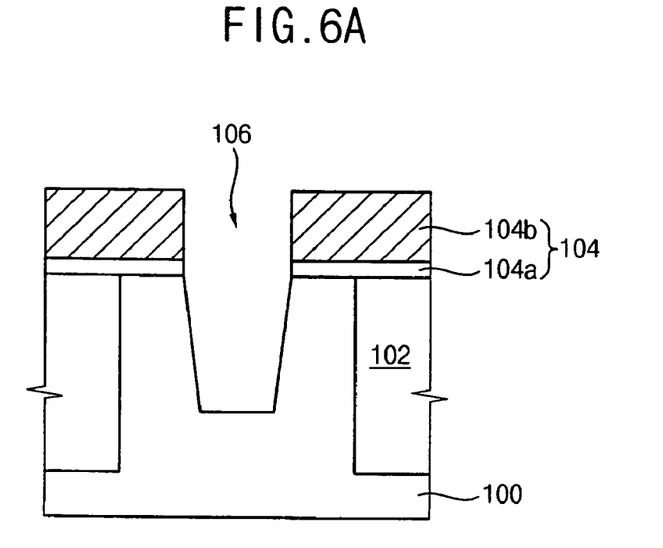
Figure 6B:
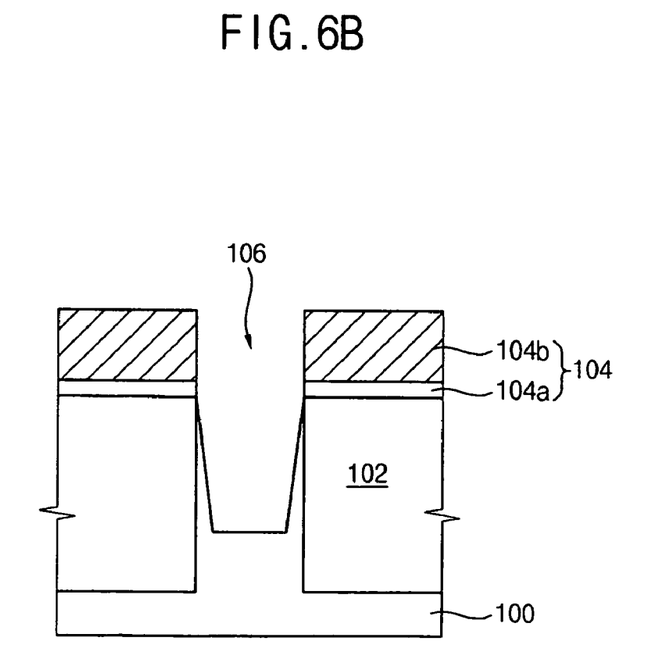

Referring to FIGS. 6A and 6B, the single crystalline silicon substrate 100 may be selectively etched using the second mask pattern 104 as an etch mask to form a preliminary recessed portion 106. It is noted that a portion of the second mask pattern 104 may remain after forming the preliminary recessed portion 106.

The selective etching process of the single crystalline silicon substrate 100 may include an anisotropic etching process. When the anisotropic etching process is performed, the preliminary recessed portion 106 may have slanted sidewalls.

For example, as illustrated in FIGS. 6A-6B, an upper width of the preliminary recessed portion 106, e.g., as measured between facing faces of the pad oxide layer pattern 104a, may be larger than a lower width of the preliminary recessed portion 106, e.g., as measured along a bottom surface of the preliminary recessed portion 106 defined by the single crystalline silicon substrate 100. Since portions of the single crystalline silicon substrate 100 are removed to define the first through fourth sidewalls of the preliminary recessed portion 106, a bottom surface of the preliminary recessed portion 106 may be exposed.

Figure 7A:
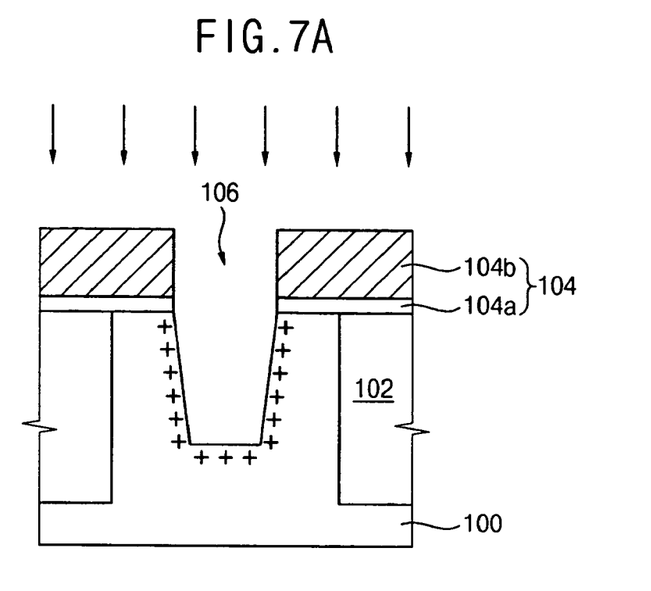
Figure 7B:
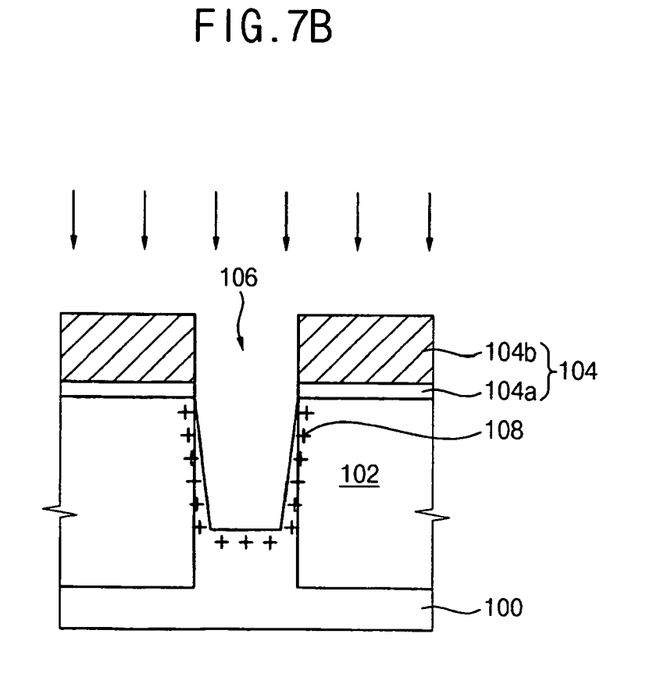

Referring to FIGS. 7A and 7B, impurities may be implanted into the single crystalline silicon substrate 100 using the second mask pattern 104 as an ion implantation mask to form a preliminary channel doping region 108. As illustrated in FIGS. 7A-7B, the impurities may be implanted along sidewalls of the preliminary recessed portion 106 and in the bottom surface of the preliminary recessed portion 106, so the preliminary channel doping region 108 may be formed to surround the entire preliminary recessed portion 106, i.e., along sidewalls and bottom surface of the preliminary recessed portion 106.

The impurities in the preliminary channel doping region 108 may have a conductive type different from that of the recessed channel transistor. For example, when an N type recessed channel transistor is manufactured, P type impurities may be implanted into the single crystalline silicon substrate 100 to form the preliminary channel doping region 108. In the impurity doping process, the preliminary channel doping region 108 may not be formed under a flat upper surface of the active region because the second mask pattern 104 may be used as the ion implantation mask.

Figure 8A:
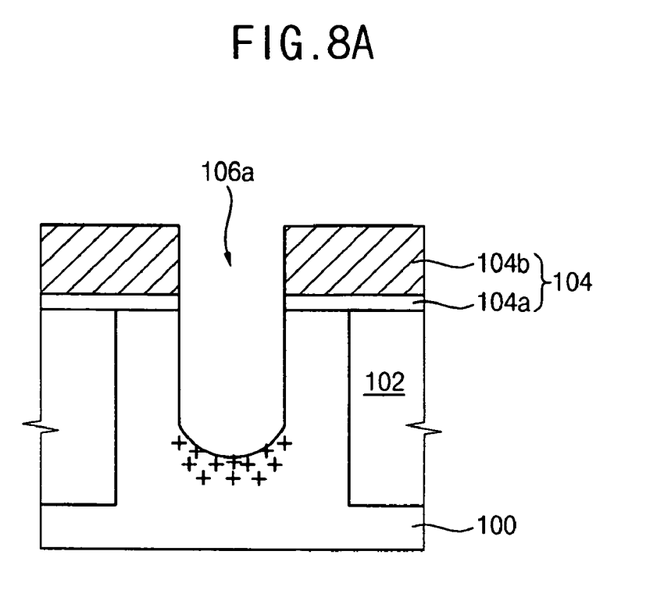
Figure 8B:
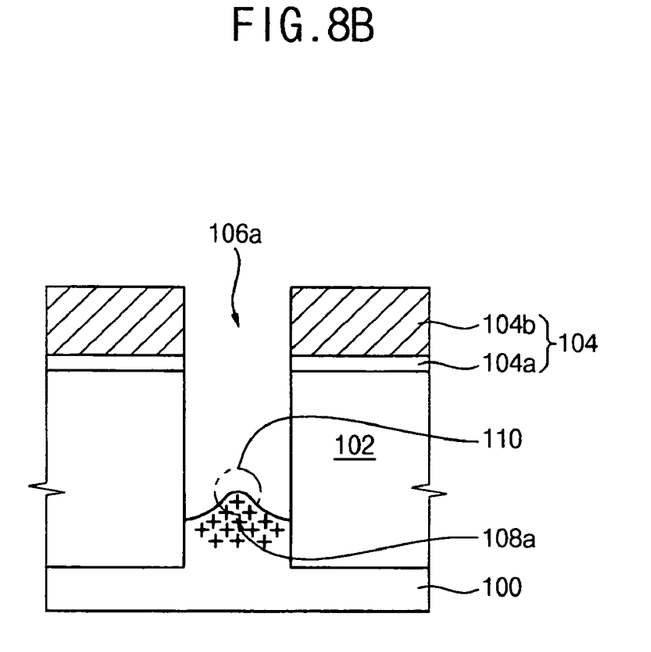

Referring to FIGS. 8A and 8B, the single crystalline silicon substrate 100 may be thermally treated at an atmosphere including hydrogen, so silicon atoms in the single crystalline silicon substrate 100 along sidewalls of the preliminary recessed portion 106 may move in a downward direction. In implementation, the single crystalline silicon substrate 100 may be thermally treated, e.g., rapidly heated at a temperature of about 700° C. to about 1,000° C. for about 10 seconds to about 60 seconds, in the presence of hydrogen, i.e., so hydrogen may be applied to the single crystalline silicon substrate 100. For example, the temperature may be about 1,000° C. A temperature above about 1,000° C. may generate an excessive thermal budget, so a resultant recessed channel transistor may have poor electrical characteristics. The rapid thermal treatment may be performed under a pressure of about 10 Torr to about 760 Torr.

When the single crystalline silicon substrate 100 is thermally treated under the hydrogen atmosphere, silicon atoms in the single crystalline silicon substrate 100 along the sidewalls and the bottom surface of the preliminary recessed portion 106 may move in a downward direction, i.e., in a direction oriented toward the lowermost surface of the single crystalline silicon substrate 100. Since the silicon atoms along the sidewalls of the preliminary recessed portion 106 move in a downward direction, the silicon atoms may transform portions of the slanted sidewalls of the preliminary recessed portion 106 to form the recessed portion 106a with sidewalls configured along substantially vertical planes. For example, the isolation layer patterns 102 may be exposed through the first and second sidewalls of the recessed portion 106a. Since silicon atoms may transform portions of the slanted sidewalls of the preliminary recessed portion 106 in a downward direction, the silicon atoms under the bottom surface of the preliminary recessed portion 106 may move to a central portion of the bottom surface in the preliminary recessed portion 106 to form the elevated central portion 110 in the recessed portion 106a.

When the silicon moves in a downward direction along the sidewalls of the preliminary recessed portion 106 and toward a center of the bottom surface of the preliminary recessed portion 106, impurities implanted in the silicon along the sidewalls of the preliminary recessed portion 106 may move with the silicon atoms to the bottom surface of the preliminary recessed portion 106. Therefore, the impurities of the preliminary channel doping region 108 of FIGS. 7A-7B may be locally concentrated in the single crystalline silicon substrate 100 only under the elevated central portion 110 of the recessed portion 106a to define the channel doping region 108a.

As discussed above, a self-aligned local channel implant (SALCI) may be used to implant impurities in the recessed portion 106a, followed by thermal treatment, without direct doping of the impurities only under the bottom surface of the recessed portion 106a in the ion implantation process. Further, because the channel doping region 108a may be formed in the single crystalline silicon substrate 100 only under the bottom surface of the recessed portion 106a, the channel doping region 108a may not be in contact with the source/drain regions 116a and 116b. As a result, the recessed channel transistor manufactured according to an example embodiment may have a substantially reduced leakage current. In contrast, when impurities in a conventional transistor are implanted through a photoresist pattern in an entire recess of a substrate, i.e., including sidewalls of the conventional recess, impurities are not limited to a region under the bottom surface of the recess and, therefore, source/drain regions may contact the channel doping region, thereby increasing leakage current.

Figure 9A:
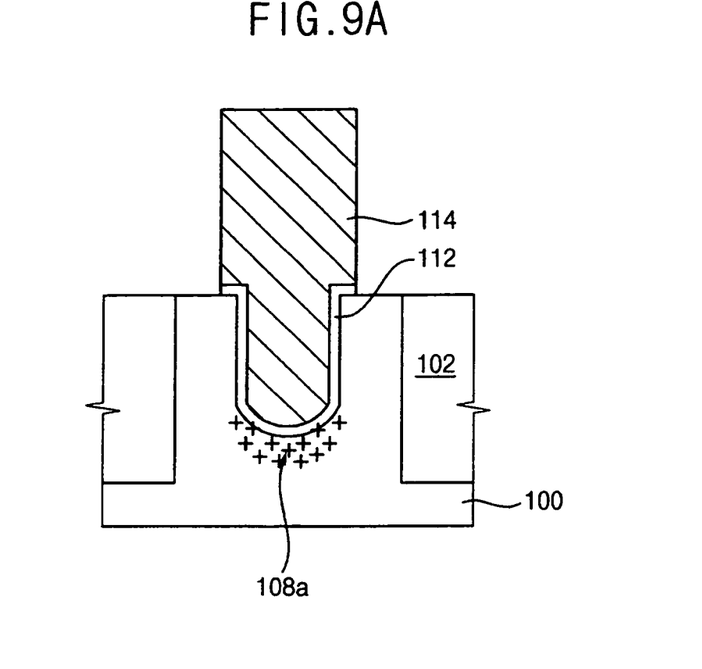
Figure 9B:
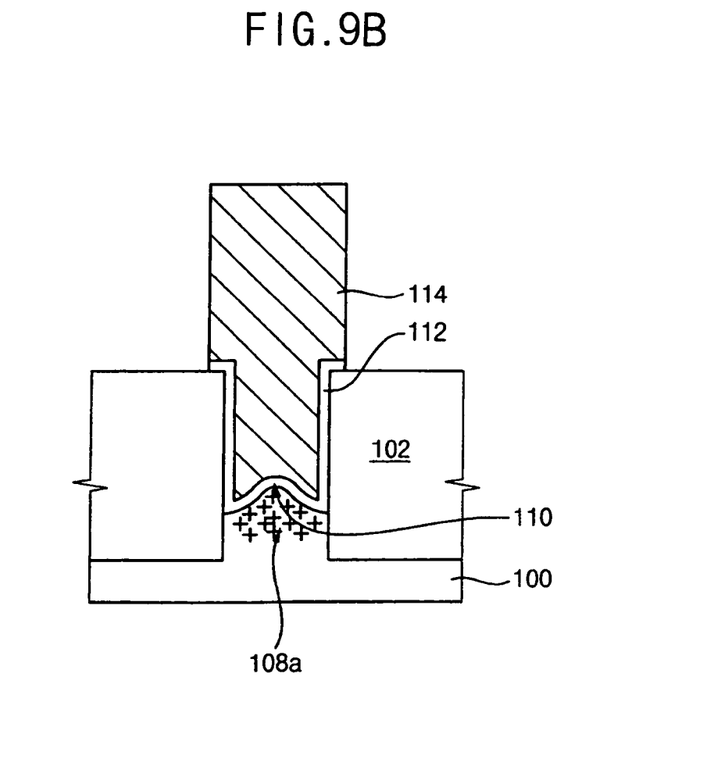

Referring to FIGS. 9A and 9B, the second mask pattern 104 may be removed from the single crystalline silicon substrate 100. Next, the gate insulating layer 112 may be formed on the sidewalls and the bottom surface of the recessed portion 106a. The gate insulating layer 112 may be formed by a thermal oxidation process using, e.g., a silicon oxide. Thus, the gate insulating layer 112 may be formed along the elevated central portion 110 of the bottom surface of the recessed portion 106a. As a result, the recessed channel transistor according to an example embodiment may have an increased gate width, as discussed previously with reference to FIGS. 1-3.

A conductive layer (not shown) may be formed on the gate insulating layer 112 and the single crystalline silicon substrate 100 to fill up the recessed portion 106a. The conductive layer may have a thickness greater than a height of the gate electrode. The conductive layer may include a conductive material, e.g., polysilicon doped with impurities, metal, conductive metal nitride, and so forth. The conductive layer may have a single-layered structure or a multi-layered structure. The conductive layer may be formed by, e.g., a LPCVD process, a CVD process, a sputtering process, a PECVD process, a pulse laser deposition process, an ALD process, and so forth. When the conductive layer includes polysilicon doped with impurities, after forming a polysilicon layer on the gate insulating layer 112, the polysilicon layer may be doped with impurities by, e.g., an impurity diffusion process, an ion implantation process, and so forth. Alternatively, the conductive layer may be formed by doping the impurities by an in-situ process when the polysilicon layer is formed. The conductive layer may be patterned, e.g., by a photolithography process, to form the gate electrode 114.

The gate electrode 114 may have a shape extending in a direction substantially perpendicular to the lengthwise direction of the active pattern, e.g., along the z-axis illustrated in FIG. 1. Since the gate insulating layer 112 is formed along the elevated central portion 110 of the recessed portion 106a, the gate electrode 114 may be configured to surround the elevated central portion 110. Although not shown in the figures, the gate electrode 114 may be formed by forming a hard mask pattern on the conductive layer, and etching the conductive layer using the hard mask pattern as an etch mask. In this case, the hard mask pattern may remain on the gate electrode 114.

Figure 10A:
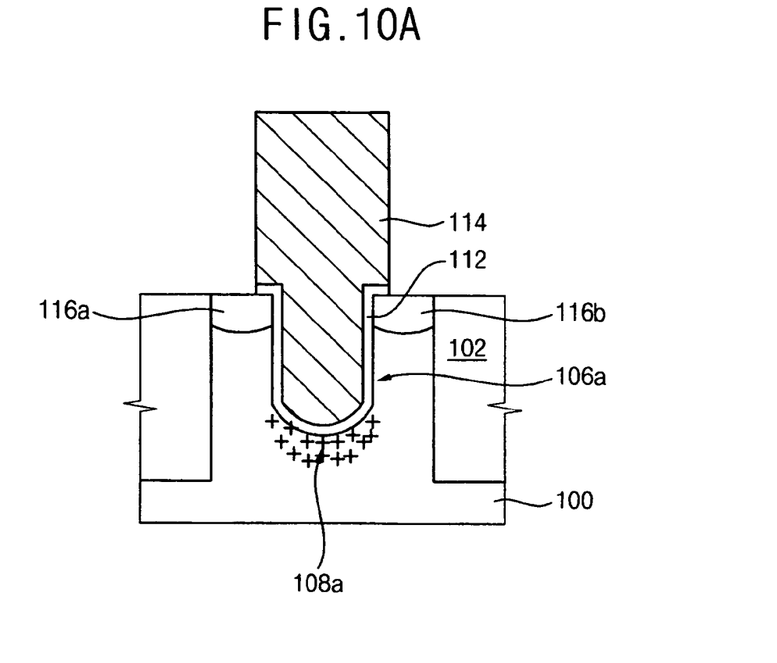
Figure 10B:
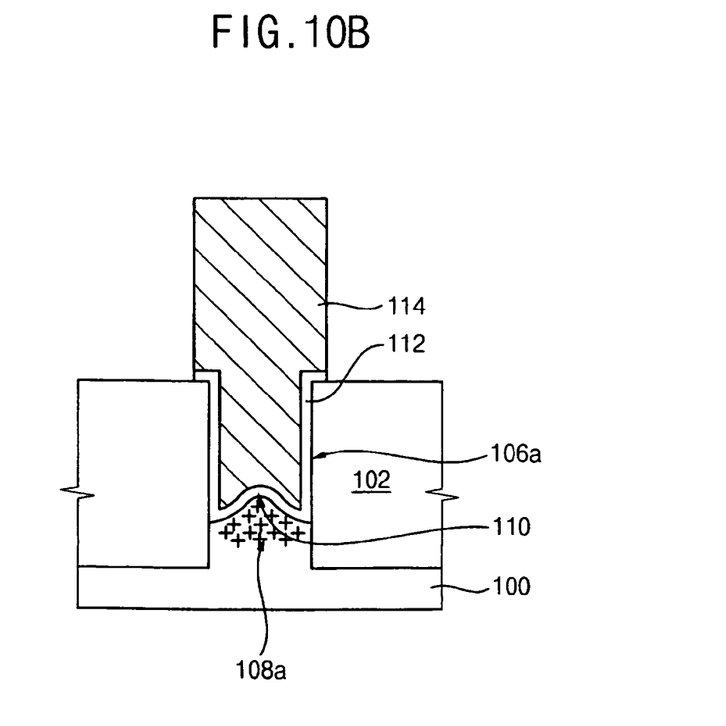

Referring to FIGS. 10A and 10B, impurities may be implanted into the active region using the gate electrode 114 as an ion implantation mask to form the source/drain regions 116a and 116b. The impurities in the source/drain regions 116a and 116b may have a conductive type different from that of the impurities in the channel doping region 108a. Further, the source/drain regions 116a and 116b may not make contact with the channel doping region 108a, as discussed previously with respect to formation of the channel doping region 108a in FIGS. 8A-8B.

Figure 11:
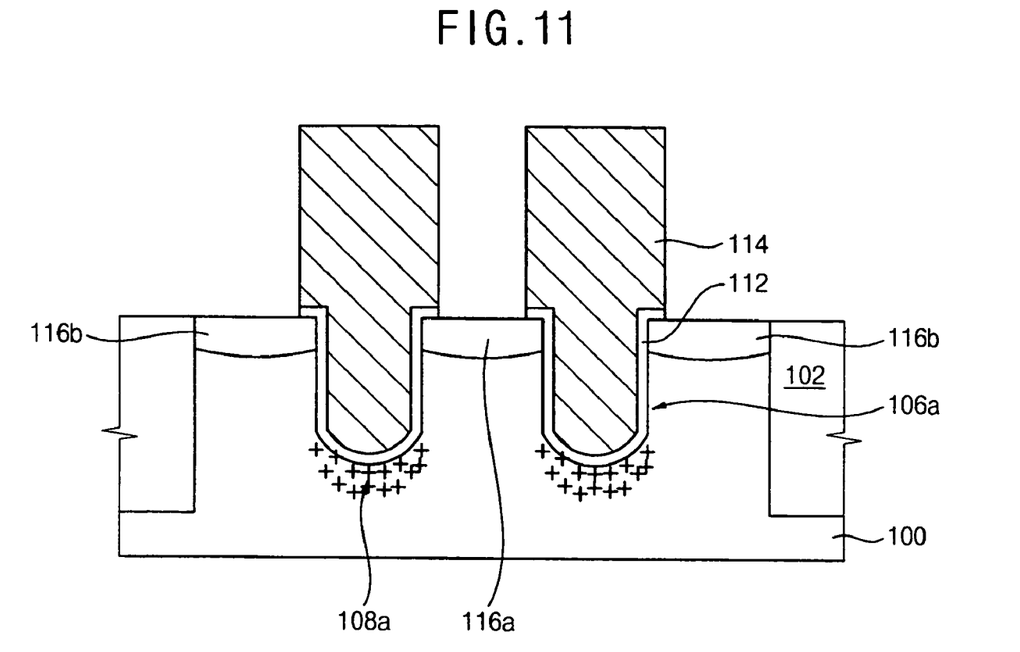
FIG. 11 illustrates a cross-sectional view of a cell of a semiconductor memory device in accordance with an example embodiment.

According to another example embodiment, as illustrated in FIG. 11, a semiconductor memory device, e.g., a DRAM device, may include a cell with the recessed channel transistor described previously with reference to FIGS. 1-10B. For example, as illustrated in FIG. 11, the DRAM device may include two channel transistors in an isolated active region.

Referring to FIG. 11, the active region in the cell of the DRAM device may have the isolated island shape. The two recessed channel transistors 130 may be formed in the isolated active region. Each of the recessed channel transistors 130 may commonly use the source region 116a connected to a bit line. A method of manufacturing the recessed channel transistor in FIG. 11 may be substantially the same as that illustrated with reference to FIGS. 4 to 10 except for an exposed portion of a mask pattern that may be used for forming the recessed portion 106a as an etch mask. Thus, any further illustrations with respect to the method of manufacturing the recessed channel transistor in FIG. 11 are omitted herein for brevity. After forming the recessed channel transistor in FIG. 11, although not depicted in drawings, processes for forming a bit line contact, a bit line, a storage node contact and a capacitor may be further performed to complete a DRAM device.

According to example embodiments, a recessed channel transistor may have a minute gate width and a desired capacity, and may exhibit a reduced junction leakage current and a reduced channel-off leakage current. Thus, the recessed channel transistor of the example embodiments may be used for a cell transistor of a semiconductor memory device, e.g., a DRAM. For example, the reduced leakage current of the recessed channel transistor according to an example embodiment may provide a DRAM device with a reduced refresh period, i.e., by sufficiently lengthening a data retention time of each of the cells.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A recessed channel transistor, comprising:
    a single crystalline silicon substrate having a recessed portion, a bottom surface of the recessed portion including an elevated central portion;
    a doped region in the single crystalline silicon substrate below the bottom surface of the recessed portion and the elevated central portion;
    a gate structure in the recessed portion; and
    source/drain regions in the single crystalline silicon substrate at both sides of the recessed portion, the source/drain regions being spaced apart from the doped region and the bottom surface of the recessed portion.

2. The recessed channel transistor as claimed in claim 1, wherein a width of the elevated central portion substantially equals a distance between the source region and the drain region, the width of the elevated central portion being measured along a direction parallel to a line connecting the source and drain regions.

3. The recessed channel transistor as claimed in claim 1, wherein the gate structure has a non-planar bottom surface, the bottom surface of the gate structure corresponding to a surface profile of the elevated central portion.

4. The recessed channel transistor as claimed in claim 1, wherein the elevated central portion of the bottom surface of the recessed portion includes a narrow edge protruding upward along a vertical direction, the vertical direction being perpendicular to a plane supporting the single crystalline silicon substrate, and the doped region includes impurity ions concentrated below the narrow edge.

5. The recessed channel transistor as claimed in claim 1, wherein the source/drain regions are completely spaced apart from the bottom surface of the recessed portion along a vertical direction, the vertical direction being perpendicular to a plane supporting the single crystalline silicon substrate.

6. The recessed channel transistor as claimed in claim 1, further comprising an isolation layer pattern in the single crystalline silicon substrate, the isolation layer pattern defining an active region.

7. The recessed channel transistor as claimed in claim 6, wherein the recessed portion is in the active region, and the isolation layer pattern defines a sidewall of the recessed portion.

8. The recessed channel transistor as claimed in claim 6, wherein the recessed portion is in the active region, the recessed portion having a first sidewall, a second sidewall, a third sidewall and a fourth sidewall, the single crystalline silicon substrate being exposed through the first and second sidewalls facing each other, and the isolation layer pattern being exposed through the third and fourth sidewalls facing each other.

9. The recessed channel transistor as claimed in claim 1, wherein the doped region is doped with impurities having a conductivity different from a conductivity of impurities in the source/drain regions.

10. The recessed channel transistor as claimed in claim 1, wherein the gate structure protrudes from the upper surface of the single crystalline silicon substrate.

11. The recessed channel transistor as claimed in claim 1, wherein the doped region is doped with impurity ions, and the impurity ions are concentrated in the single crystalline silicon substrate under the bottom surface of the recessed portion and the elevated central portion.

12. The recessed channel transistor as claimed in claim 1, wherein the doped region is highly doped with impurity ions under only the bottom surface of the recessed portion and the elevated central portion.

13. The recessed channel transistor as claimed in claim 1, wherein the recessed portion includes an upper sidewall spaced apart from the bottom surface of the recessed portion and a lower sidewall adjacent to the bottom surface of the recessed portion, the upper sidewall being spaced apart from the doped region.

14. The recess channel transistor as claimed in claim 13, wherein the upper sidewall of the recessed portion is spaced apart from impurity ions in the doped region.

15. The recessed channel transistor as claimed in claim 1, wherein the doped region is a highly doped channel doping region, and an area in the single crystalline silicon substrate adjacent to the highly doped channel doping region is a lightly doped channel portion, the highly doped channel doping region including more ion impurities than the lightly doped channel portion.

16. The recessed channel transistor as claimed in claim 1, wherein the bottom surface of the recessed portion and the elevated central portion include thermally treated silicon atoms of the single crystalline silicon substrate.

17. The recessed channel transistor as claimed in claim 1, wherein the doped region includes concentrated impurity ions and thermally treated silicon atoms of the single crystalline silicon substrate.

18. The recessed channel transistor as claimed in claim 1, wherein the elevated central portion of the single crystalline silicon substrate includes concentrated impurity ions and concentrated thermally treated silicon atoms of the single crystalline silicon substrate.

19. The recessed channel transistor as claimed in claim 18, wherein the thermally treated silicon atoms are atoms in the single crystalline silicon substrate rapidly heated in the presence of hydrogen.

20. A semiconductor memory device, comprising:
a memory cell with at least one recessed channel transistor, the recessed channel transistor including:
a single crystalline silicon substrate having a recessed portion, a bottom surface of the recessed portion including an elevated central portion;
a doped region in the single crystalline silicon substrate below the bottom surface of the recessed portion and the elevated central portion;
a gate structure in the recessed portion, and
source/drain regions in the single crystalline silicon substrate at both sides of the recessed portion, the source/drain regions being spaced apart from the doped region and the bottom surface of the recessed portion.

* * * * *